United States Patent
Akiyama

(10) Patent No.: US 7,106,276 B2
(45) Date of Patent: Sep. 12, 2006

(54) COLOR DISPLAY DEVICE

(75) Inventor: Takashi Akiyama, Sayama (JP)

(73) Assignee: Citizen Watch Co., Ltd., Tokyo (JP)

( * ) Notice: Subject to any disclaimer, the term of this patent is extended or adjusted under 35 U.S.C. 154(b) by 412 days.

(21) Appl. No.: 10/396,509

(22) Filed: Mar. 26, 2003

(65) Prior Publication Data

US 2003/0214725 A1 Nov. 20, 2003

(30) Foreign Application Priority Data

Mar. 27, 2002 (JP) .............................. 2002-088171
Mar. 18, 2003 (JP) .............................. 2003-074515

(51) Int. Cl.
*H01L 33/00* (2006.01)

(52) U.S. Cl. ............................ 345/39; 345/48; 345/63; 345/204; 313/498; 313/502

(58) Field of Classification Search ................. 345/39, 345/42, 48, 60, 63, 68, 87, 88, 91, 204; 313/483, 313/498, 502; 315/169.4
See application file for complete search history.

(56) References Cited

U.S. PATENT DOCUMENTS

| | | | |
|---|---|---|---|
| 5,353,133 A * | 10/1994 | Bernkopf | 349/5 |
| 5,506,705 A * | 4/1996 | Yamamoto et al. | 349/13 |
| 5,953,053 A * | 9/1999 | Chen et al. | 348/14.16 |
| 6,064,423 A * | 5/2000 | Geng | 348/36 |
| 6,069,440 A | 5/2000 | Shimizu et al. | |
| 6,169,527 B1 * | 1/2001 | Kanazawa et al. | 345/60 |
| 6,188,379 B1 * | 2/2001 | Kaneko | 345/102 |
| 6,275,271 B1 * | 8/2001 | Hitomi et al. | 348/743 |
| 6,351,069 B1 | 2/2002 | Lowery et al. | |
| 6,812,966 B1 * | 11/2004 | Nakazawa | 348/333.01 |
| 2002/0021267 A1 * | 2/2002 | Walker et al. | 345/76 |
| 2002/0163680 A1 * | 11/2002 | Zabka | 359/10 |
| 2002/0167624 A1 * | 11/2002 | Paolini et al. | 349/61 |

FOREIGN PATENT DOCUMENTS

| | | |
|---|---|---|
| JP | 06-110033 | 4/1994 |
| JP | 07-333574 | 12/1995 |
| JP | 10-065221 | 3/1998 |

\* cited by examiner

*Primary Examiner*—Bipin Shalwala
*Assistant Examiner*—Vincent E. Kovalick
(74) *Attorney, Agent, or Firm*—Sughrue Mion, PLLC

(57) ABSTRACT

In a field sequential display device, a desired chromaticity of the white level can be easily achieved and fluctuations in the white level caused by fluctuation factors such as temperature characteristics can be suppressed. A light source comprises red, green, and blue LEDs and a white LED. The white LED includes a blue LED covered with a yellow fluorescent material. One field is divided into display subfields of red, green, blue and white. Only the red LED turns on in the red display subfield, only the green LED turns on in the green display subfield, only the blue LED turns on in the blue display subfield, and only the white LED turns on in the white display subfield. A shutter is controlled in each subfield based on sub-image data of each color.

21 Claims, 10 Drawing Sheets

COLOR DISPLAY DEVICE

BACKGROUND OF THE INVENTION

1) Field of the Invention

The present invention relates to a field sequential color display device that achieves multicolored display by dividing a field into a plurality of subfields, displaying a different color image in each subfield, and subjecting different color images to color mixture through the action of integration along time-axis at human eyes.

2) Description of the Related Art

Several types of field sequential display devices are known. For example, one type of the field sequential display device (see Japanese Patent Application Laid-Open No. 7-333574) is provided with a light source that emits a light with broadband wavelengths, or a white light; and a disc filter that includes a plurality of filters for respectively transmitting red (R), green (G), and blue (B) lights. When the disc filter is rotated, a wavelength zone for transmitting a light is sequentially switched to another on a subfield basis.

Another type of the field sequential display device (see Japanese Patent Application Laid-Open No. 6-110033) is provided with a color light source that emits red, green, and blue lights; a light source driver that drives the color light source; a shutter that controls the amount of transmission of the light emitted from the color light source based on display information; and a shutter controller that controls the shutter. This display device emits different color lights on a subfield basis and accordingly controls the shutter. The color light source includes a red light emitting diode (hereinafter, "red LED"), a green light emitting diode (hereinafter, "green LED"), and a blue light emitting diode (hereinafter, "blue LED").

The display device disclosed in the above-mentioned Japanese Patent Application Laid-Open No. 7-333574 employs a stabilized white light source such as a lamp, and filters of R, G, and B for full-color display. Thus, a mechanical component, such as a motor that rotates the filters, is required which results up-sizing and increase in power consumption.

The display device disclosed in the above-mentioned Japanese Patent Application Laid-Open No. 6-110033 better in that it does not require a mechanical component. However, a full-color display is impossible in this color display until the blue LED was not developed. Thus, the major use of this display device is limited in multicolored display of around four colors on a simple guideplate, for example.

Recently, a high-emission blue LED has been developed. Thus, a full-color field sequential display can be developed in combination of the high-emission blue LED with the conventional red LED and green LED. This display device has a wider color reproduction range on a chromaticity diagram of red, green, and blue, and excellent performance of full-color display, in comparison with the display device of the color filter type disclosed in the above-mentioned Japanese Patent Application Laid-Open No. 7-333574. However, color of the light emitted from LEDs varies. For example, the green light emitted from one green LED may be slightly reddish while the green light emitted from another green LED may be slightly bluish. Such color variation may cause subtle color differences from LED to LED even if the colors of the emitted lights are identical. The color variation may occur even in the same LED due to temporal variations of a current for driving the LED and temperature.

FIG. 20 shows the color light emission characteristic of a field sequential display device that employs red, green, and blue LEDs for full-color display. In FIG. 20, vertical axis represents an amount of sub-image data and horizontal axis represents time. Moreover, the color of the light output changes from red to green and then to blue as the time passes. The amount of sub-image data differs from color to color when the shutter operates in accordance with individual color data of red, green, and blue. In FIG. 20, R means a period in which the red LED is ON, G means a period in which the green LED is ON, and B means a period in which the blue LED is ON.

The red LED turns on during R period to display a red image with an amount of transmitted light based on red data Dr (=D1). The green LED turns on during G period to display a green image with an amount of transmitted light based on green data Dg (=D2). The blue LED turns on during B period to display a blue image with an amount of transmitted light based on blue data Db (=D3).

Full-color display with the use of red, green, and blue LEDs can be performed utilizing the action of integration along time-axis at human eyes under field sequential driving as shown in FIG. 20. In FIG. 20, as for parts having an equal data value in the individual color data of red Dr, green Dg and blue Db, that is, the lower parts of Dr, Dg and Db below a chain line denoted with CL, integration of the colors of red, green, and blue results in white light emission. Equivalent white data, Dw, corresponding to the white light emission is subjected to color mixture with parts of the individual color data Dr, Dg and Db above the chain line CL, (Dg' and Db' in FIG. 20), to achieve color display.

As the LED that emits white light (hereinafter referred to as white LED), there is publicly known one that includes a blue LED covered with a resin that contains fluorescent particles (see Japanese Patent Application Laid-Open No. 10-65221 and U.S. Pat. No. 6,069,440). There is another publicly known white LED that includes a blue LED covered with a resin that contains fluorescent particles and strontium to compensate for red (see Japanese Patent Application Laid-Open No. 2000-244021).

In the system for full-color display using red LEDs, green LEDs and high-emission blue LEDs, color balance in the white light emission greatly effects on the performance of the full-color display. Nevertheless, there is a problem because of difficulty to keep the chromaticity of the white level unchanged. The reason is given below. As described above, the white light emission is expressed as a mixed color when the LEDs of red, green, and blue are sequentially driven based on the individual color data Dr, Dg and Db.

Due to individual differences such as variations in luminous intensity and variations in forward voltage of individual LEDs, subtle color differences may occur depending on LEDs even if the emission colors are identical as described above. This is specifically shown in the x-y chromaticity diagram of FIG. 21. In FIG. 21, the reference numeral 101 denotes a range of colors present in the world. The reference numeral 102 denotes a range of colors that can be expressed in the National Television System Committee (NTSC) system. The reference numerals 103, 104 and 105 denote ranges of emission colors from LEDs of red, green, and blue, respectively.

In this x-y chromaticity diagram, the emission color range 103 of the red LED has x of about 0.57 to 0.64 and y of about 0.30 to 0.35. The emission color range 104 of the green LED has x of about 0.24 to 0.41 and y of about 0.54 to 0.65. The emission color range 105 of the blue LED has x of about 0.14 to 0.29 and y of about 0.05 to 0.21. Through mixture of the emission colors from LEDs of red, green, and blue that have such the color ranges, a white emission color range 106 can be obtained with x of about 0.30 to 0.50 and y of about 0.21 to 0.46.

Thus, the variations in emission colors of LEDs vary white levels from display device to display device. It is therefore difficult to equalize the chromaticity of white levels in different display devices. In a large display provided with plural LEDs per color, a light emitted from each LED interferes with others. Accordingly, it is extremely difficult to adjust the white level.

Even if differences in chromaticity of the white level among plural displays can be adjusted at the steps of producing the displays, temperature dependence present in a luminous intensity characteristic of each LED causes the following problem. As the temperature elevates, luminous intensities of red, green, and blue reduce at reduction rates each intrinsic to respective emission colors, resulting in a deviation from the initial white level already adjusted. This is specifically shown in the x-y chromaticity diagram of FIG. 22. In FIG. 22, the reference numeral 111 denotes chromaticity of the white level at 25° C., and the reference numerals 112 and 113 denote chromaticity of the white level at −10° C. and 50° C.

According to FIG. 22, x has a value equal to about 0.41 at 25° C. To the contrary, x has a value equal to about 0.50 at −10° C. and about 0.35 at 50° C. In general, if the value of x is deviated about 0.02, the color is identified as a different one. Therefore, the value of x fluctuates within 0.35 to 0.50 due to the temperature characteristic as in the example of FIG. 22, and the color can no longer keep white depending on temperatures. As a measure against this problem, it is considered to provide an additional temperature compensator. Each LED is different from others in power consumption and in amount of heat, however. Accordingly, even if the additional temperature compensator is provided, it is difficult to effectively suppress temperature fluctuations.

It is possible to compensate for fluctuations in environmental temperatures to some extent. The need of individual non-linear compensations for fluctuations and the presence of variations in luminous intensities cause a problem of complex and large temperature compensators.

Each LED is individually different in lifetime and durability and accordingly has a problem that the white level is varied in a long term. This is not disadvantageous, however, if the use is not for a long time.

In the conventional art, LEDs of red, green, and blue are turned on simultaneously to create white. In particular, even if LEDs of red, green, and blue are turned on sequentially to create white using the action of integration along time-axis at human eyes, it is extremely important and difficult to keep the chromaticity of the white level unchanged.

SUMMARY OF THE INVENTION

It is an object of the present invention to at least solve the problems in the conventional technology.

The display device according to one aspect of the present invention comprises a light source that emits a plurality of individually controllable color lights having different spectral characteristics, the color lights including a white light; and a shutter that controls transmission or reflection of the lights emitted from the light source. A field is divided into a plurality of subfields to emit a specific color light corresponding to each subfield from the light source, and to control the shutter corresponding to each subfield.

The display device according to another aspect of the present invention comprises a light source that emits a plurality of individually controllable color lights having different spectral characteristics; and a shutter that controls transmission or reflection of the lights emitted from the light source. A field is divided into a plurality of subfields to emit a specific color light corresponding to each subfield from the light source, and to control the shutter corresponding to each subfield, and one of the subfields is employed for white light display.

The other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 13 shows a luminescence intensity characteristic when a white LED is turned on;

DETAILED DESCRIPTION

Exemplary embodiments of the display device of the present invention will now be explained in detail with reference to the accompanying drawings.

Figure 2:
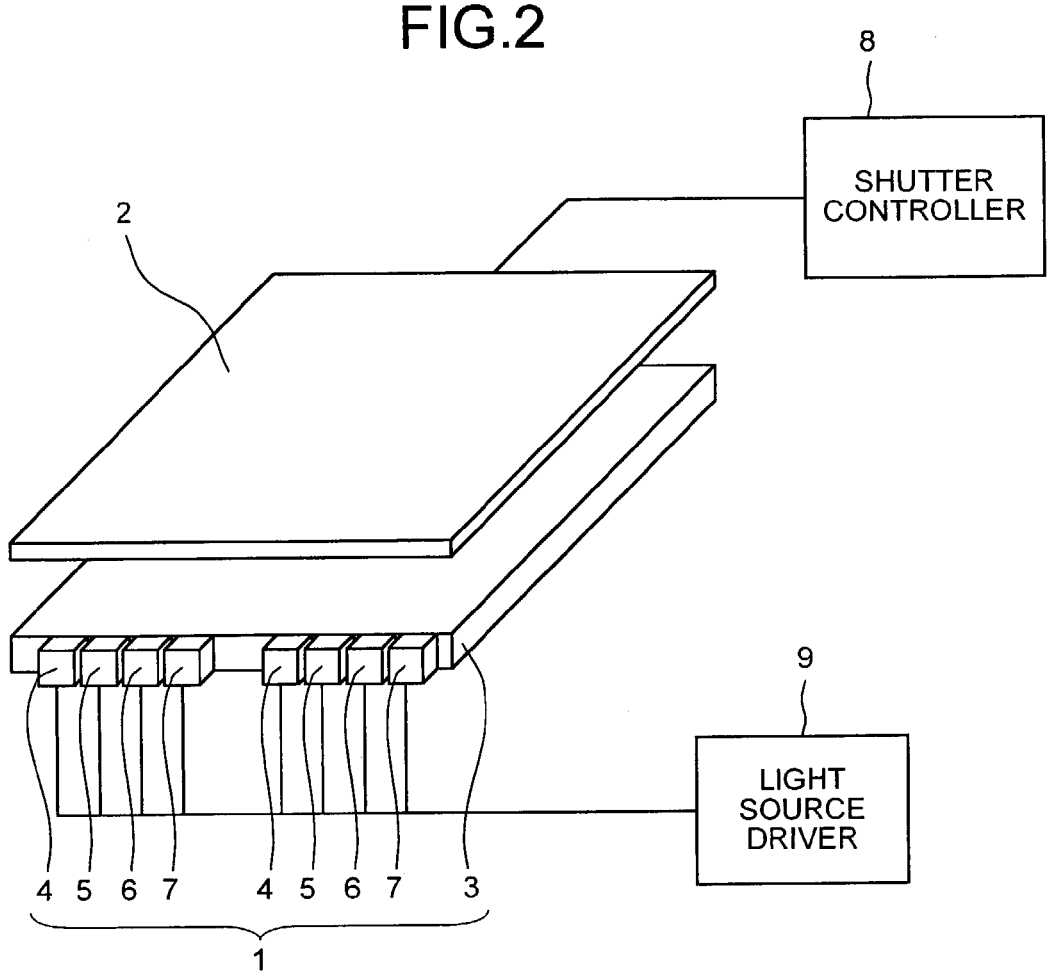
FIG. 2 shows a configuration of the display device according to the embodiment of the present invention.

FIG. 2 schematically shows the configuration of a display device according to an embodiment of the present invention. This display device comprises a light source 1 that includes a plurality of independently controllable color light sources that emit lights having different spectral characteristics.

It is assumed here that the display device is a full-color display device. The light source 1 includes a plurality (two are shown in the diagrams) of red LEDs 4, a plurality (two are shown in the diagrams) of green LEDs 5, a plurality (two are shown in the diagrams) of blue LEDs 6, and a plurality (two are shown in the diagrams) of white LEDs 7 at the side of a light guide plate 3. There is no limit to the number of the LEDs of each color, although at least one white LED is required. A light source driver 9 drives the light source 1.

The display device also comprises a shutter 2 that controls transmission of the lights emitted from the light source 1. A shutter controller 8 controls the shutter 2. The shutter 2 is, for example, a thin liquid crystal panel excellent in shutter performance though it is not limited specially. The shutter 2 is driven based on the thin film transistor (TFT) active driving method that can achieve high-contrast matrix display even in a fast-response liquid crystal device.

The shutter 2 has an arrangement of matrix display provided with (n×m) pixels though it is not shown specially. The shutter 2 includes a liquid crystal panel that contains 90-degree twisted liquid crystal molecules sealed between two substrates. Upper and lower polarizing plates thereof are in the normally white mode. Each TFT is arranged at each of (n×m) pixels on the substrate, from which a source line and a gate line are led out and connected to the shutter controller 8.

Figure 3:
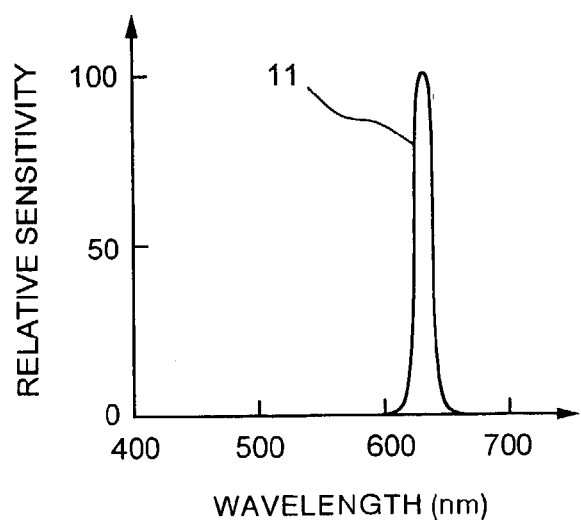
FIG. 3 shows a spectral sensitivity characteristic of a red LED in the display device shown in FIG. 2.
Figure 4:
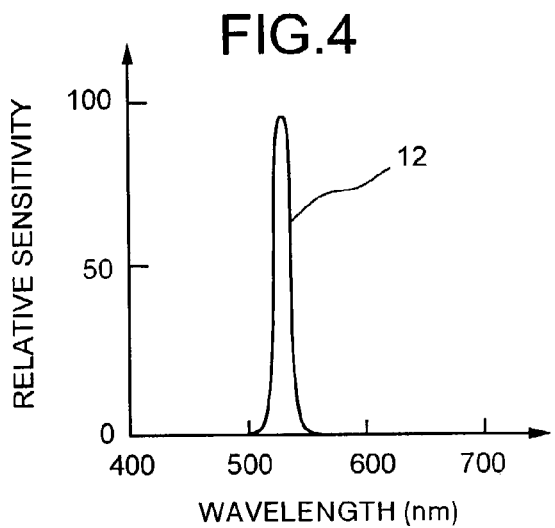
FIG. 4 shows a spectral sensitivity characteristic of a green LED in the display device shown in FIG. 2.
Figure 5:
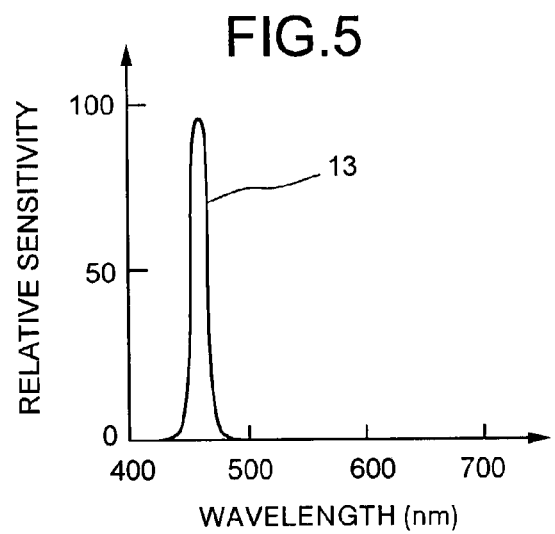
FIG. 5 shows a spectral sensitivity characteristic of a blue LED in the display device shown in FIG. 2.

FIGS. 3 to 6 show spectral sensitivity characteristics of the LEDs in the display device shown in FIG. 2. In these figures, the horizontal axis represents wavelength λ in nanometer (nm) and the vertical axis represents a relative sensitivity with the largest emission being made as 100 percent. FIG. 3 shows a spectral sensitivity characteristic 11 of the red LED 4 and it has a peak at a wavelength of 624 nm. FIG. 4 shows a spectral sensitivity characteristic 12 of the green LED 5 and it has a peak at a wavelength of 515 nm. FIG. 5 shows a spectral sensitivity characteristic 13 of the blue LED 6 and it has a peak at a wavelength of 468 nm.

Figure 6:
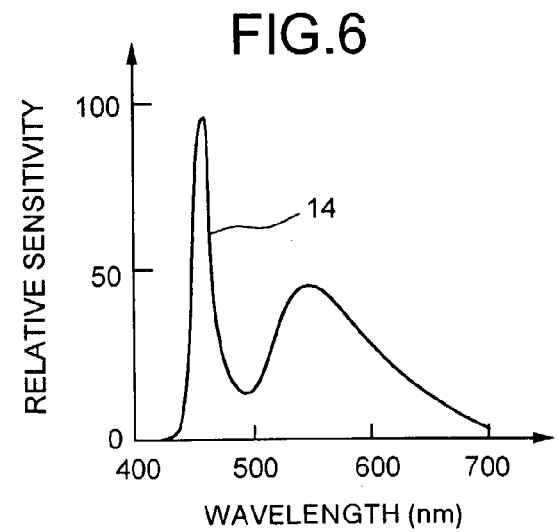
FIG. 6 shows a spectral sensitivity characteristic of a white LED in the display device shown in FIG. 2.

The white LED 7 includes a blue LED with a yellow fluorescent material applied thereon. FIG. 6 shows a spectral sensitivity characteristic 14 of the white LED 7 and it has one peak at a wavelength of 468 nm and another peak at a wavelength of 555 nm. The spectral sensitivity characteristic 14 of the white LED 7 extends up to 700 nm. Although there is no specific limitation, even the LEDs disclosed in the above-mentioned Japanese Patent Application Laid-Open No. 10-65221, U.S. Pat. No. 6,069,440, and Japanese Patent Application Laid-Open No. 2000-244021 may be employed as the white LED 7.

Since the white LED 7 employs only a blue LED the characteristics of the white LED 7 has an extremely smaller variation in the white balance, in comparison to expression of white by color mixture of lights emitted from red, green, and blue LEDs. This is because the light source serving as the white LED 7 includes only a single blue LED. If LEDs have similar variations, the mixed white emission is effected from variations in three LEDs. To the contrary, the white LED 7 is effected from only a variation in one LED, and the fluorescent material applied over the upper surface of the blue LED has a small density variation.

Figure 7:
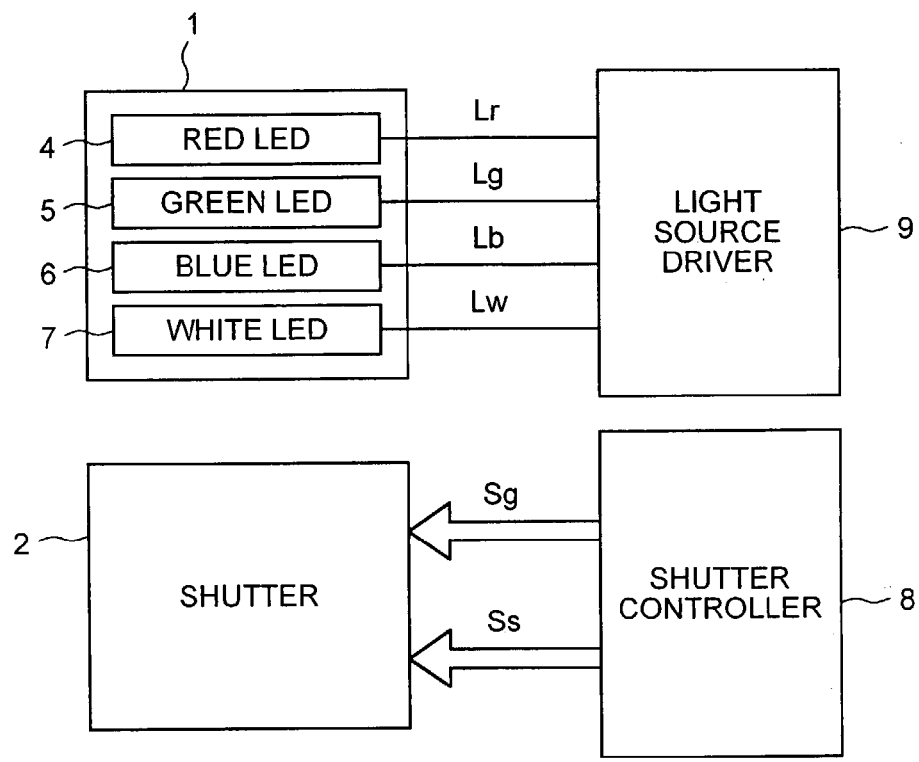
FIG. 7 shows how the display device shown in FIG. 2 operates.

FIG. 7 shows a block diagram of the display device shown in FIG. 2. The light source 1 comprises a plurality of sets of the red LED 4, green LED 5, blue LED 6 and white LED 7 although only one set is shown. The red LED 4, green LED 5, blue LED 6 and white LED 7 are turned on/off respectively based on a red LED turn-on signal Lr, a green LED turn-on signal Lg, a blue LED turn-on signal Lb and a white LED turn-on signal Lw supplied from the light source driver 9.

The shutter 2 has a matrix structure of (n×m) driven with m gate-line drive signals Sg and n source-line drive signals Ss supplied from the shutter driver 8. The shutter driver 8 converts input image data into pieces of sub-image data corresponding to the red LED 4, green LED 5, blue LED 6 and white LED 7, respectively. The shutter driver 8 further converts the sub-image data into the source-line drive signal Ss corresponding to the LED and outputs it.

In general, image data can be converted into the source-line drive signals Ss in a gray-scale display method, such as a voltage amplitude modulation that varies amplitude of the source-line drive signals Ss based on the image data; and a time-axis modulation that varies a time for applying the source-line drive signals Ss having a constant voltage. The voltage amplitude modulation is employed in this case, for example, though either method can be applied. In the present embodiment, the amplitude of the source-line drive signals Ss varies depending on the sub-image data accordingly.

Figure 8:
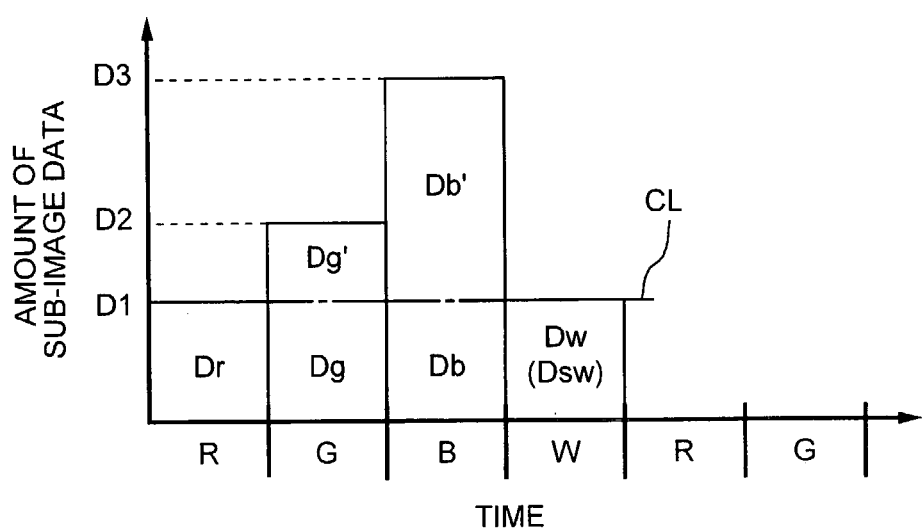
FIG. 8 shows a color emission characteristic in the display device shown in FIG. 2.
Figure 9:
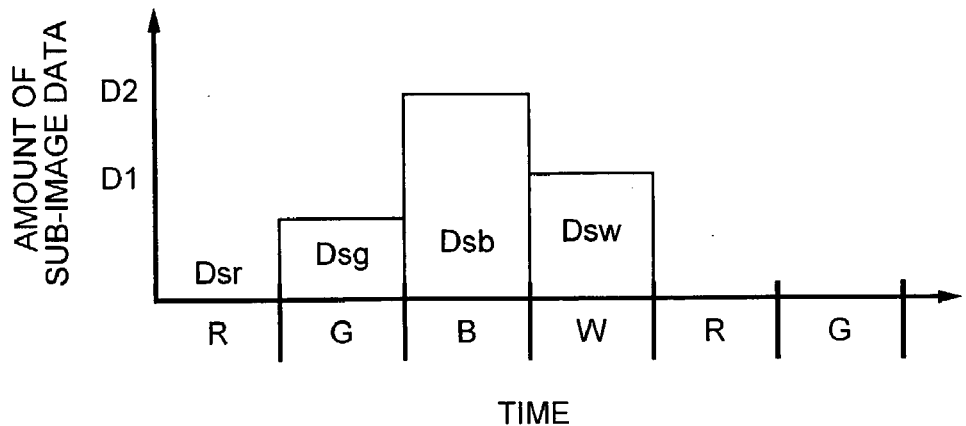
FIG. 9 shows individual color data in the display device shown in FIG. 2.

A display method of the field sequential type is explained next. FIGS. 8 and 9 show the same display states as the color emission characteristic in the conventional field sequential display device shown in FIG. 20, which are converted into those in the display method of sequentially turning on LEDs of four colors of red, green, blue and white. Differences from the color emission characteristic in the conventional field sequential display device shown in FIG. 20 are explained below.

Figure 20:
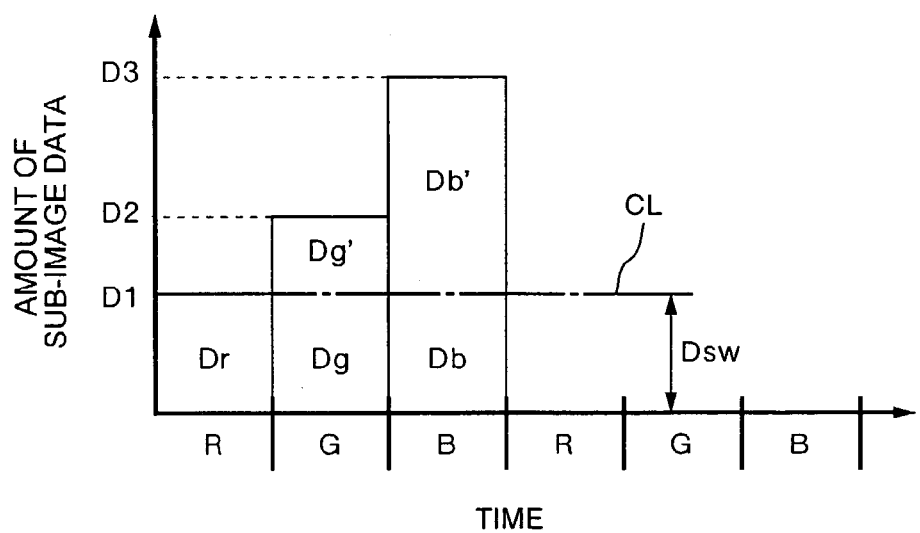
FIG. 20 shows a color emission characteristic in a field sequential display device for full-color display using red, green, and blue LEDs.
Figure 21:
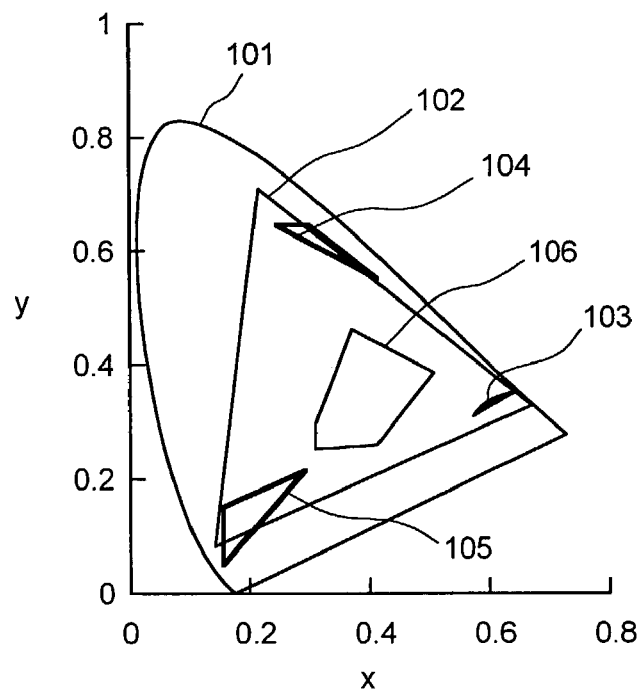
FIG. 21 shows emission colors from red, green, and blue LEDs, and ranges of color mixture obtained from the emission colors.
Figure 22:
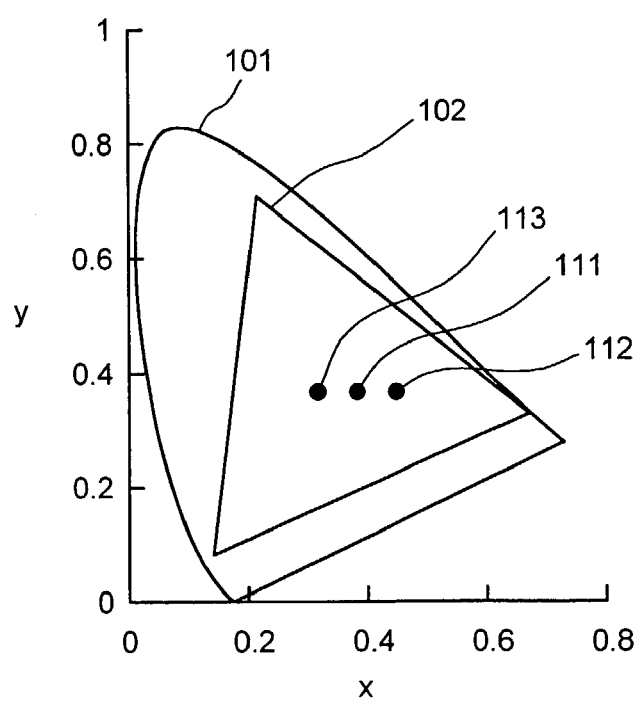
FIG. 22 shows temperature characteristics of color mixtures obtained from emission colors from red, green, and blue LEDs.

FIG. 8 is a color emission characteristic diagram that explains conversion of the conventional display method of the field sequential type shown in FIG. 20 into the display method of the field sequential type using LEDs of four colors. As shown in FIG. 8, one field is divided into four subfields of; R period for turning on the red LED 4; G period for turning on the green LED 5; B period for turning on the blue LED 6; and W period for turning on the white LED 7.

The white data Dw for controlling the amount of transmission of the light from the white LED 7 is an equal part among data values of the individual color data of red Dr, green Dg and blue Db. That is, in FIG. 8, the white data Dw is the lower part below the chain line CL that indicates the least value among the individual color data Dr, Dg and Db. In the example of FIG. 8, Dw is D1.

FIG. 9 shows sub-image data given to the shutter 2 in an actual display device based on the color emission characteristic shown in FIG. 8. As shown in FIG. 9, white sub-image data Dsw is the lower part Dw below the chain line CL in FIG. 8 as explained in relation to FIG. 8. Green sub-image data Dsg and blue sub-image data Dsb are the upper parts of Dg and Db above the chain line CL of FIG. 8, or Dg' and Db'. Red sub-image data Dsr is zero.

In the example shown in FIG. 8, the red data Dr simply contributes to white emission. It turns to zero and does not contribute to red emission as shown in FIG. 9 when the white LED 7 is arranged. Therefore, the total emission from the whole display device exhibits color mixture of white emission by the white data Dw (=Dsw), green emission by the green data Dg' (=Dsg) and blue emission by the blue data Db' (=Dsb). In the examples shown in FIGS. 8 and 9, the red data Dr is assumed as the least. If the green data Dg is the least, the green data Dg simply contributes to white emission. In this case, the total emission from the whole display device exhibits color mixture of white emission, red emission and blue emission, as when the blue data Db is the least.

Figure 1:
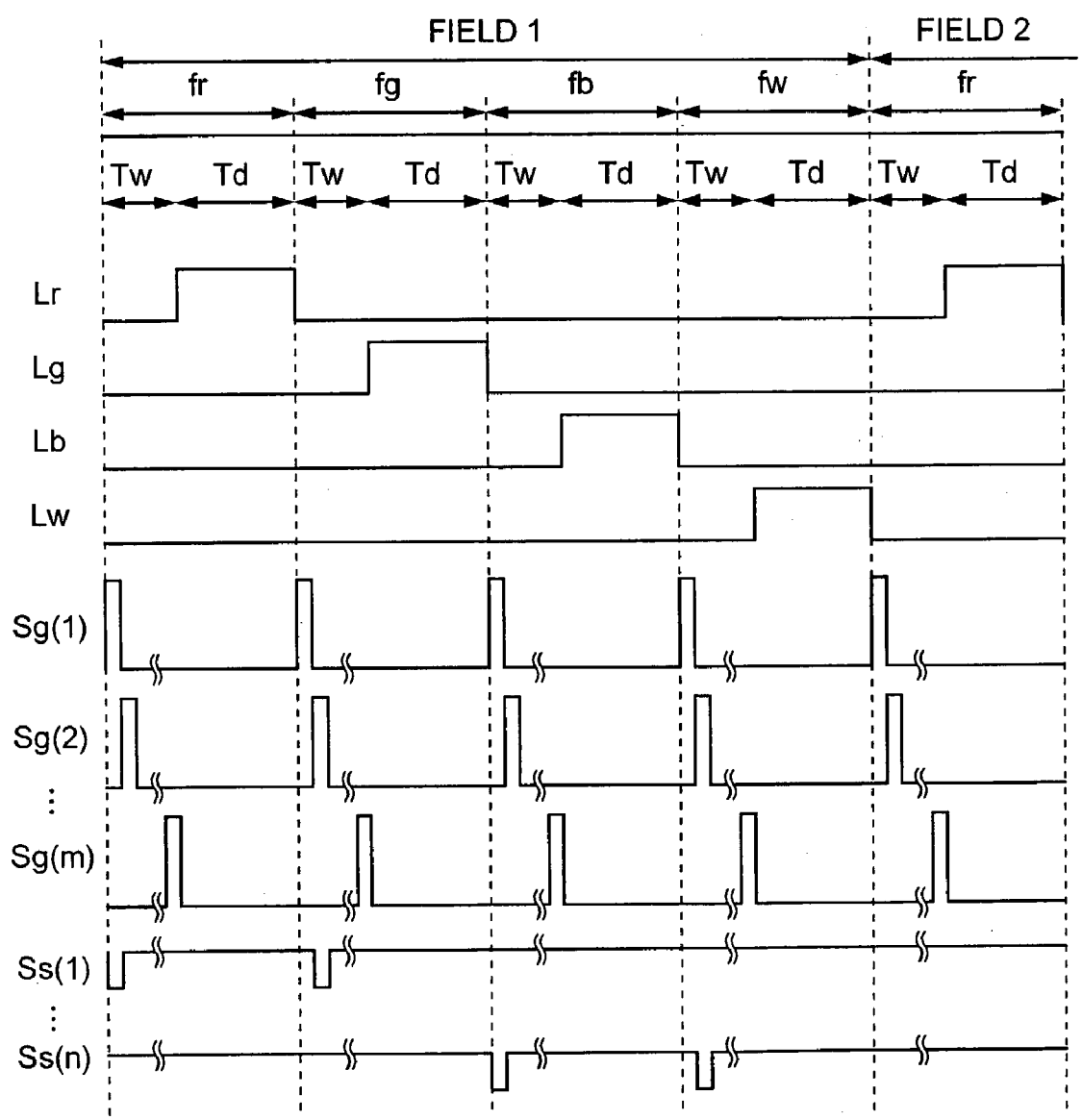
FIG. 1 shows waveforms of signals in a display device according to an embodiment of the present invention.

The turn-on signals Lr, Lg, Lb and Lw for the LEDs and the drive signals Sg and Ss for the gate lines and source lines are explained with respect to their timing. FIG. 1 shows waveforms of these signals. Suffixes (1), (2), (m) and (n) attached to the gate-line drive signals Sg and the source-line drive signals Ss indicate that they are employed for driving individual gate lines or source lines.

As shown in FIG. 1, one field for holding one display image consists of four subfields fr, fg, fb and fw. One subfield consists of two periods. The first half of each subfield is a write period Tw and the second half is a display period Td.

During the write period Tw, the shutter controller 8 operates, and a voltage is applied to each pixel area in the liquid crystal panel through a TFT based on sub-image data corresponding to each subfield. In other words, during the write period Tw, the source-line drive signals Ss(1) to Ss(n) are provided with source voltages based on sub-image data corresponding to respective subfields. The gate-line drive signals from Sg(1) to Sg(m) are provided with sequential selection voltages applied to respective gate lines. As a result, a TFT connected to the selected gate line is turned on to apply a voltage based on the sub-image data to the pixel area corresponding to the TFT.

The display period Td is employed to display the image written during the write period Tw. During the display period, the light source driver 9 sequentially supplies the turn-on signals Lr, Lg, Lb and Lw for respective LEDs. In the white display subfield fw, the white LED turn-on signal Lw is switched to the level for turning the LED on during the display period Td. In this case, the LED turn-on signals of red Lr, green Lg and blue Lb are kept at the level for turning the LED off. Accordingly, during the display period Td in the white display subfield fw, only the white LED 7 is allowed to emit.

Similarly, in the subfields fr, fg and fb, during the respective display period Td, the red LED turn-on signal Lr, the green LED turn-on signal Lg and the blue LED turn-on signal Lb are switched to the level for turning the LED on. As a result, only the red LED 4, the green LED 5 and the blue LED 6 are allowed to emit only during the respective display period Td.

In the respective subfield, the LED turn-on signals Lr, Lg, Lb and Lw are switched to the level for turning the LED on during the display period Td and to the level for turning the LED off during the write period Tw. This is effective to prevent color mixture and elevate chroma.

Otherwise, before completion of writing an image corresponding to the LED to be turned on next, that is, while the immediately previous image remains in the shutter 2, the LED turns on. This causes color mixture because the image to be displayed can not match the color of the light emitted from the LED. The present embodiment prevents such the color mixture by turning off the LEDs during the write period Tw as described above.

Input image data is converted into pieces of sub-image data to be displayed in subfields, respectively. This method is explained with reference to the flowchart of FIG. 10. As an example, the input image data relates to the digital interface for use in the mobile terminal display standard, and corresponds to RGB 16-bit data available for 65,536-color display that is common for full-color display device in the mobile terminal. The RGB 16-bit data consists of red 5 bits, green 6 bits and blue 5 bits arrayed from the Most Significant Bit (MSB), that is, 16 bits of R (5 bits)/G (6 bits)/B (5 bits).

Figure 10:
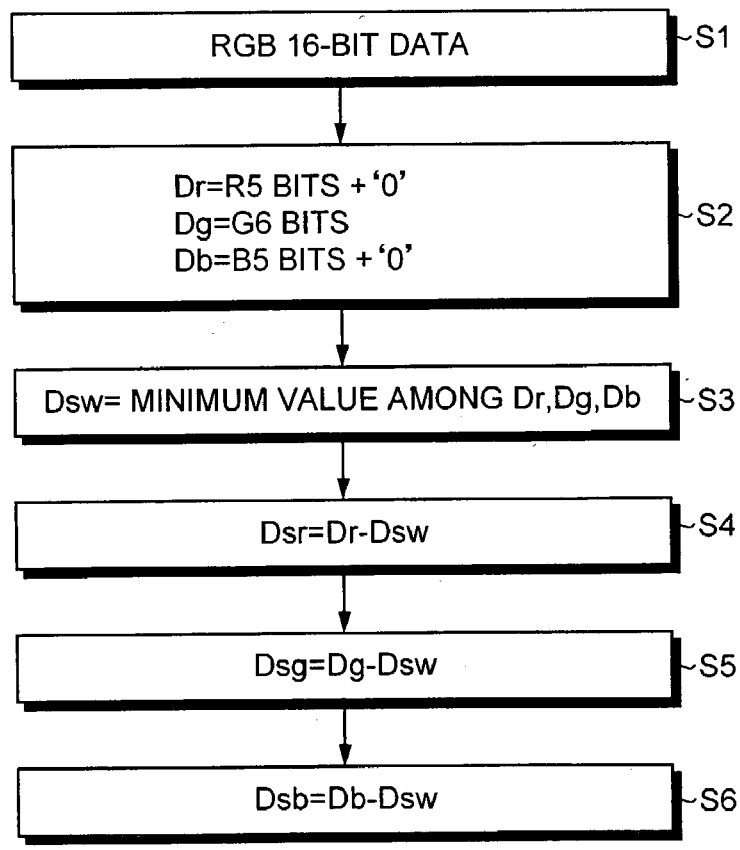
FIG. 10 is a flowchart of an arithmetic processing of sub-image data performed by the display device shown in FIG. 2.

As shown in FIG. 10, when RGB 16-bit data enters (step S1), the RGB 16-bit data is separated on a color-light basis to obtain pieces of individual color data: 6-bit red data Dr, 6-bit green data Dg, and 6-bit blue data Db (step S2). In this case, the red light data and the blue light data each consist of 5 bits in the original RGB 16-bit data. Therefore, they are assigned to the upper 5 bits in the red data Dr and the blue data Db, and 0 to the Least Significant Bit (LSB), respectively, to yield the 6-bit data.

The white sub-image data Dsw for white display in the white display subfield fw is derived by an arithmetic processing (step S3). The arithmetic processing includes deriving the least value (minimum value) from the individual color data Dr, Dg and Db obtained in the conversion at the step S2 and assigning the minimum value to the white sub-image data Dsw. As explained in relation to FIG. 8, the white sub-image data Dsw is the lower part below the chain line CL that indicates the minimum value of the individual color data Dr, Dg and Db in FIG. 8.

Then, red sub-image data Dsr, green sub-image data Dsg and blue sub-image data Dsb are generated for red, green, and blue display in the red display subfield fr, the green display subfield fg and the blue display subfield fb (steps S4, S5 and S6). The sub-image data of each color has a value respectively represented by the following equations (1), (2) and (3):

$$Dsr = Dr - Dsw \quad (1)$$

$$Dsg = Dg - Dsw \quad (2)$$

$$Dsb = Db - Dsw \quad (3)$$

As explained in relation to FIGS. 8 and 9, the sub-image data of red Dsr, green Dsg and blue Dsb are the upper parts of the individual color data Dr, Dg and Db above the chain line CL of FIG. 8. Through such the arithmetic processing, the input RGB 16-bit data can be easily converted into the red sub-image data Dsr, the green sub-image data Dsg, the blue sub-image data Dsb and the white sub-image data Dsw. In other words, the present embodiment is such that the white display subfield fw is newly provided while it can display a full-color image based on the RGB 16-bit data that is the interface similar to the conventional art one.

When the images corresponding to the sub-image data thus obtained are fed to the shutter 2 during the write period Tw in the subfield, they are integrated along time-axis at human eyes so that full-color display of 65,536 colors can be seen. In this case, one field is optimally designed to have a frequency of about 100 Hz to prevent human eyes from sensing flickers. Thus, each subfield is optimally driven at 400 Hz.

In the display device according to the present embodiment, the brightness of the white LED 7 to be turned on during the white display subfield fw can be adjusted to display a much more natural and better color image. Prior to explanation of this adjusting method, a relation between luminescence intensity and brightness of a light source in each subfield is explained first. The brightness represents brilliancy on an article seen from human eyes.

Figure 11:
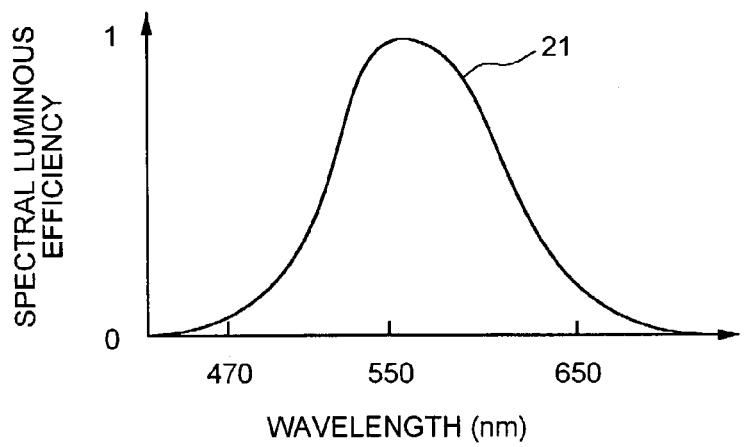
FIG. 11 shows a spectral luminous efficiency.

The bright intensity is sensed at human eyes in different ways depending on wavelengths. This is called a spectral luminous efficiency characteristic. For adjustment of the brightness, it is required to consider the spectral luminous efficiency characteristic. FIG. 11 shows a curve of spectral luminous efficiency viewed in the light (light vision). In FIG. 11, the horizontal axis indicates a wavelength and the vertical axis a spectral luminous efficiency. As shown in FIG. 11, a spectral luminous efficiency characteristic 21 has the maximum in a wavelength zone near green or 555 nm and reduces toward 470 nm at the blue side as well as 670 nm at the red side. As well known, human eyes feel green brightest, red next, and blue darkest.

Figure 12:
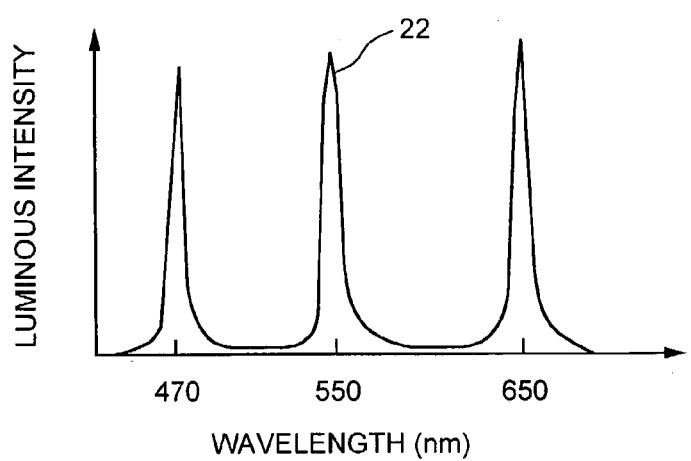
FIG. 12 shows a luminescence intensity characteristic when red, green, and blue LEDs are turned on simultaneously.
Figure 13:
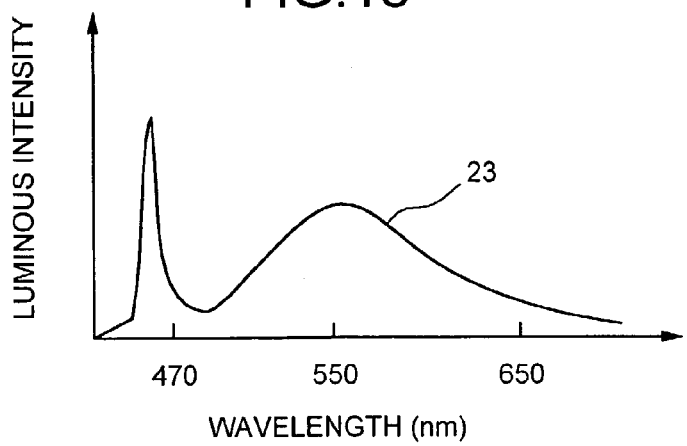

A luminous characteristic of the LED light source on the other hand is generally represented by an amount of energy or a luminescence intensity characteristic. The characteristic of human eyes is therefore not considered in the luminescence intensity characteristic. FIG. 12 shows a luminescence intensity characteristic when the red LED 4, the green LED 5 and the Blue LED 6 are simultaneously turned on to emit a white light. FIG. 13 shows a luminescence intensity characteristic when the white LED 7 is turned on to emit a white light. In FIGS. 12 and 13, the horizontal axis indicates a wavelength and the vertical axis a luminescence intensity (unit: W).

A luminescence intensity characteristic 22 in FIG. 12 and a luminescence intensity characteristic 23 in FIG. 13 both show characteristics that can be observed white from human eyes. In the luminescence intensity characteristic 22 shown in FIG. 12, three colors of blue, green and red are mixed to configure white. To the contrary, in the luminescence intensity characteristic 23 shown in FIG. 13, blue and yellow are mixed to configure white. Thus, regardless of difference in wavelength configuration between both, the mixed color is seen white at human eyes.

As explained in relation to FIGS. 8 and 9, the data value of the equal part among the individual color data of red data Dr, green data Dg and blue data Db (the lower part below the chain line CL in FIG. 8) in the display subfields of red fr, green fg and blue fb is employed as the white sub-image data Dsw in the white display subfield fw for white display. Therefore, it is most preferable if the white to be displayed based on the data below the chain line CL of FIG. 8 in the display subfields of red fr, green fg and blue fb is visually same as the white to be displayed in the white display subfield fw.

For that, both white are required to have the same brightness. In other words, the brightness of the light source having the luminescence intensity characteristic 22 shown in FIG. 12 is required to match the brightness of the light source having the luminescence intensity characteristic 23 shown in FIG. 13. The brightness can be derived from the luminescence intensity characteristic when the luminescence intensity characteristic is multiplied by the spectral luminous efficiency characteristics and integrated by wavelengths.

Figure 14:
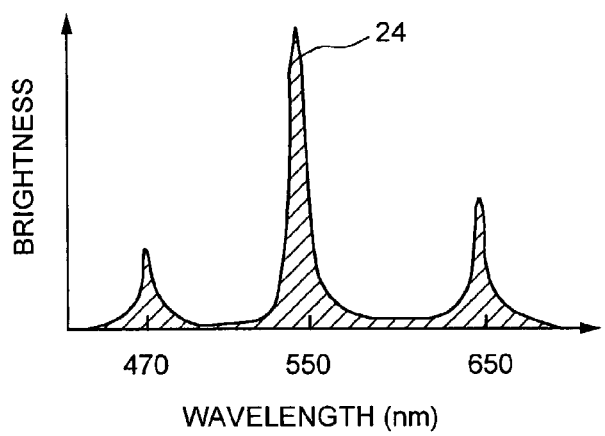
FIG. 14 shows a brightness characteristic in consideration of the spectral luminous efficiency shown in FIG. 11 relative to the luminescence intensity characteristic shown in FIG. 12.

FIG. 14 shows a brightness characteristic in consideration of the spectral luminous efficiency characteristics shown in FIG. 11 relative to the luminescence intensity characteristic shown in FIG. 12. This brightness characteristic 24 is derived from the luminescence intensity characteristic 22 shown in FIG. 12 multiplied by a constant and multiplied by the spectral luminous efficiency characteristics 21 shown in FIG. 11 to represent a brightness at each wavelength. Therefore, the total brightness Yrgb of the whole light source consisting of LEDs of red 4, green 5 and blue 6 is equal to the area derived from integration by wavelengths below the curve of the brightness characteristic 24.

Figure 15:
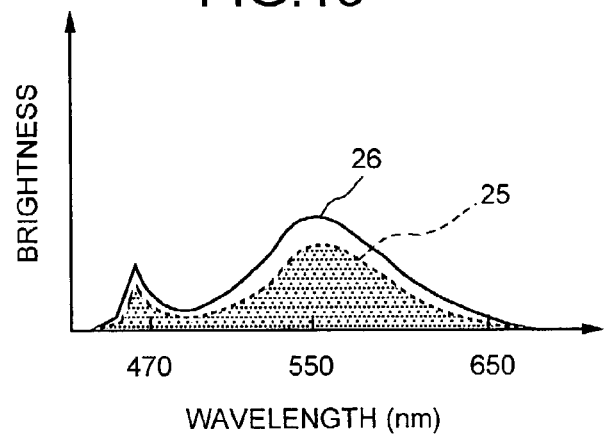
FIG. 15 shows a brightness characteristic in consideration of the spectral luminous efficiency shown in FIG. 12 relative to the luminescence intensity characteristic shown in FIG. 12.

FIG. 15 shows a brightness characteristic 25 in consideration of the spectral luminous efficiency characteristics shown in FIG. 11 relative to the luminescence intensity characteristic shown in FIG. 13. This represents a brightness at each wavelength derived from the same arithmetic processing as that for the brightness characteristic 24 of FIG. 14. The brightness Yw of the white LED 7 is equal to the area derived from integration by wavelengths below the curve of the brightness characteristic 25 in FIG. 15. In brightness adjustment for the white LED 7, the brightness Yw of the white LED 7 is adjusted to have a value equal to the simultaneously emitted brightness Yrgb of the whole light source consisting of LEDs of red 4, green 5 and blue 6.

In general, when light sources (LEDs) of red, green, and blue are present and they have respective brightness of r, g and b, the brightness of the whole light source can be represented experientially from the spectral luminous efficiency by the following equation (4):

$$\text{Brightness} = 0.298912 \times r + 0.586611 \times g + 0.114478 \times b \tag{4}$$

When the largest brightness of the light sources (LEDs) of red, green, and blue are represented by Yr, Yg and Yb, respectively, and they are assigned into the equation (4), the largest brightness of the whole light source, Yrgb, can be derived from the following equation (5):

$$Yrgb = 0.298912 \times Yr + 0.586611 \times Yg + 0.114478 \times Yb \tag{5}$$

Therefore, in the brightness adjustment of the white LED 7, it is theoretically sufficient if Yw is adjusted to satisfy the following equation (6):

$$Yw = 0.298912 \times Yr + 0.586611 \times Yg + 0.114478 \times Yb \tag{6}$$

The equation (6) is derived from a general experience. Therefore, coefficients of Yr, Yg and Yb are not limited in those used in the equation (6) but may have almost similar numerical values. The Inventors have performed experiments with varying these three coefficients and found that sufficiently natural display can be obtained even if Yw is adjusted to satisfy the following equation (7):

$$Yw = 0.3 \times Yr + 0.5 \times Yg + 0.2 \times Yb \tag{7}$$

The maximum brightness Yr of the red light source (LED) is defined as the brightness of the red light viewed when the shutter 2 is set to provide the red sub-image data Dsr with the maximum transmissivity in the red display subfield fr. In this case, the shutter 2 is also set to provide the sub-image data of green Dsg, blue Dsb and white Dsw with the minimum transmissivity. This definition can be similarly given to the maximum brightness Yg of the green light source (LED) and the maximum brightness Yb of the blue light source (LED). That is, they are each defined as the brightness of the light viewed when the shutter 2 is set to provide the corresponding sub-image data with the maximum transmissivity in the corresponding display subfield, and other sub-image data with the minimum transmissivity. If the sub-image data is set to have the minimum transmissivity, the corresponding light source (LED) may be turned off.

It is not actually required to derive the brightness from such the conversion. For example, a commercially available luminance meter may be employed to measure the brightness in the following steps and adjust it based on the measured value. The luminance meter contains filers therein to compensate for the visibility.

Among the display subfields of red fr, green fg, blue fb and white fw, in the display subfields of red fr, green gr and blue fb, the sub-image data with the maximum transmissivity is employed for display. In the white display subfield fw, the sub-image data with the minimum transmissivity (for example, zero) is employed for display.

Thus, the brightness of the red display subframe can be adjusted to the maximum brightness Yr of the red LED 4. The brightness of the green display subframe can be adjusted to the maximum brightness Yg of the green LED 5, and the brightness of the blue display subframe to the maximum brightness Yb of the blue LED 6. The brightness of the white display subframe can be adjusted to zero. Accordingly, the brightness of the whole frame has the sum of Yr, Yg and Yb, which is equal to Yrgb. This brightness Yrgb can be measured using the luminance meter.

The luminance meter is prepared in a condition capable of sufficiently integrating the brightness of light in the display subframes of red, green, and blue. In other words, the luminance meter is adjusted to have a lower sampling frequency than the frequency of the subframe.

In the display subfields of red fr, green fg and blue fb, the sub-image data with the minimum transmissivity (for example, zero) is employed for display. In the white display subfield fw, the sub-image data with the maximum transmissivity is employed for display. The luminance meter is employed to measure the brightness Yw at that time to adjust the forward current flowing into the white LED 7 to be turned on in the white display subfield fw so that the brightness Yw has a value equal to the previously measured Yrgb. This adjustment allows a natural color image to be displayed.

Figure 16:
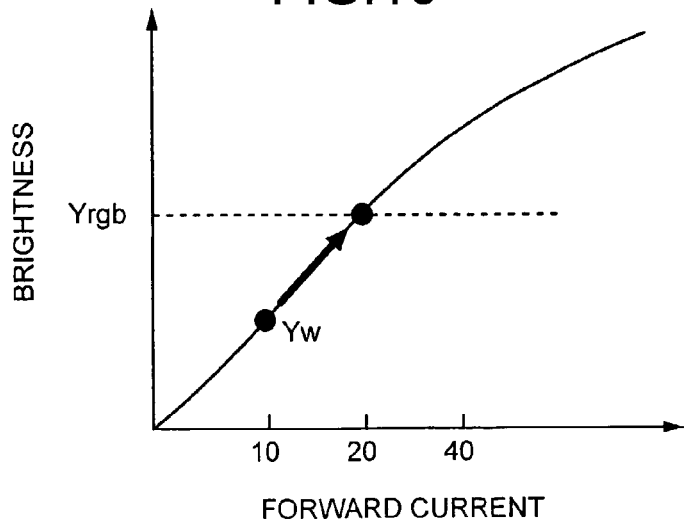
FIG. 16 shows a method of adjusting brightness for white display by a forward current in a white LED.

FIG. 16 shows a forward current characteristic of the brightness of the white LED 7. In FIG. 16, the forward current in the white LED is increased to match Yw with Yrgb when Yw is smaller than Yrgb. In response to this adjustment, the original brightness characteristic 25 varies to the adjusted brightness characteristic 26 as shown in FIG. 15. According to the brightness adjustment, the area derived from integration by wavelengths below the curve of the adjusted brightness characteristic 26 comes to have the same value as the area derived from integration by wavelengths below the curve of the brightness characteristic 24 of FIG. 14.

Figure 17:
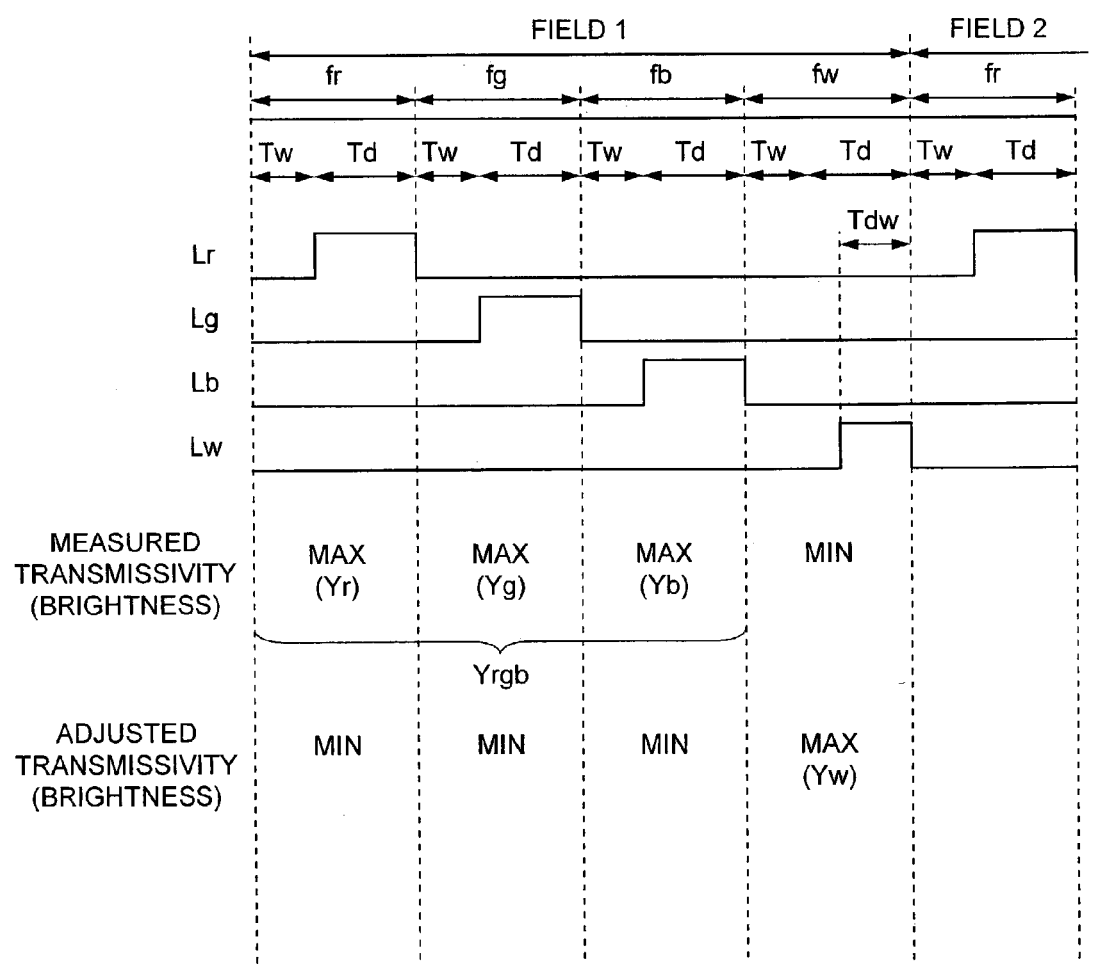
FIG. 17 shows a method of adjusting brightness for white display by an emission time of a white LED.

Instead of the adjustment of the forward current in the white LED 7, with keeping the emission brightness of the white LED 7 unchanged, the emission time of the white LED 7 in the white display subfield fw may be adjusted to adjust the brightness for white display. FIG. 17 shows the emission timing for each LED in this adjusting method. As shown in FIG. 17, one field consists of four subfields fr, fg, fb and fw and each subfield consists of a write period Tw in the first half and a display period Td in the second half.

In the display subfields of red fr, green fg and blue fb, the LED turn-on signals of red Lr, green Lg and blue Lb are switched to the level for turning the LED on during the display period Td, respectively, to turn on only the LED of the corresponding color. To the contrary, in the white display subfield fw, the white LED turn-on signal Lw is switched to the level for turning the LED on in the display period Td only during Tdw ($\leq$Td). In the rest of the display period Td other than Tdw, the white LED turn-on signal Lw is kept at the level for turning the LED off. An initial condition requires previous elevation of the brightness of the white LED 7 to adjust the white LED turn-on signal Lw to Tdw shorter than the display period Td.

The white LED 7 turns on only during Tdw in the white display subfield fw. Accordingly, when the period of Tdw is adjusted, the emission time of the white LED 7 in the white display subfield fw varies so that the brightness for white display in the white display subfield fw can be adjusted.

In practice, the luminance meter is employed to measure the brightness Yrgb of the whole frame of red, green, and blue at the steps similar to those of adjusting the forward current. For display in the display subfields of red fr, green fg and blue fb, each sub-image data is provided with the minimum transmissivity (for example, zero), and in the white display subfield fw, the sub-image data is provided with the maximum transmissivity. The luminance meter is employed to measure the brightness Yw at that time and the turn-on time Tdw is adjusted within Td for the white LED 7 to be turned on in the white display subfield fw so that the brightness Yw has a value equal to the previously measured Yrgb. This adjustment also allows a natural color image to be displayed.

In another adjusting method, the maximum shutter apertures for the display subfields of red fr, green fg and blue fb in the liquid crystal panel that configures the shutter 2 are different from that for the white display subfield. In this case, the amount of sub-image data input to the liquid crystal panel may be converted in a way, and the shutter characteristic of the liquid crystal panel may be switched in another way.

In a different adjusting method, the number of LEDs of red, green, blue and white may be increased or decreased. As explained later, when LEDs of red 4, green 5 and blue 6 are provided one each, one white LED 7 may be provided in an arrangement (FIG. 18), or two white LEDs 7 may be provided in another arrangement (FIG. 19). This method can effectively adjust the brightness by increasing the number of the white LEDs 7 to elevate the maximum brightness for white display even if the brightness can not be adjusted optimally because Yrgb is higher than the maximum brightness of the white LED 7.

Instead of adjustment of the brightness or emission time of the white LED 7, the brightness or emission time of the LEDs of red 4, green 5 and blue 6 may be adjusted. For example, if the amount of emission from the white LED 7 is maximized, the amounts of emission from the LEDs of red 4, green 5 and blue 6 may be adjusted to match it.

An arrangement of the light source 1 is explained next. One of the two groups of red, green, blue and white LEDs provided in the arrangement shown in FIG. 2 is explained below. The other LED group also has the same arrangement. In the example shown in FIG. 18, there are red LED 31, green LED 32, and blue LED 33, and a blue LED 34 for configuring the white LED 7.

The LEDs 31 to 34 are implemented on a substrate 41 and sealed in a resinous package. The blue LED 34 for configuring the white LED 7 is covered in a transparent resin 42 that contains fluorescent particles 43. The LEDs of red 31, green 32 and blue 33 are covered in a resin 44, which is a transparent resin generally employed to seal LEDs.

Anode electrodes of the LEDs 31 to 34 are commonly connected to an anode line on the substrate 41. The anode line on the substrate 41 is led out of the package as an anode electrode of the whole LED group, not shown. Cathode electrodes of LEDs of red 31, green 32, blue 33, and blue 34 for configuring the white LED 7 are connected to the corresponding cathode lines on the substrate 41, respectively. The cathode lines on the substrate 41 are led out of the package as a cathode electrode of the red LED 31 not shown, a cathode electrode of the green LED 32 not shown, a cathode electrode 45 of the blue LED 33, and a cathode electrode 46 of the blue LED 34 for configuring the white LED 7.

In the example shown in FIG. 19, there are the red LED 31, the green LED 32, and the blue LED 33, and two blue LEDs 34 for configuring the white LED 7. In the example shown in FIG. 19, as an anode electrode 47 of the whole LED group, the anode line on the substrate 41 is led out of the package. Other arrangements are similar to those of the example shown in FIG. 18.

Figure 18:
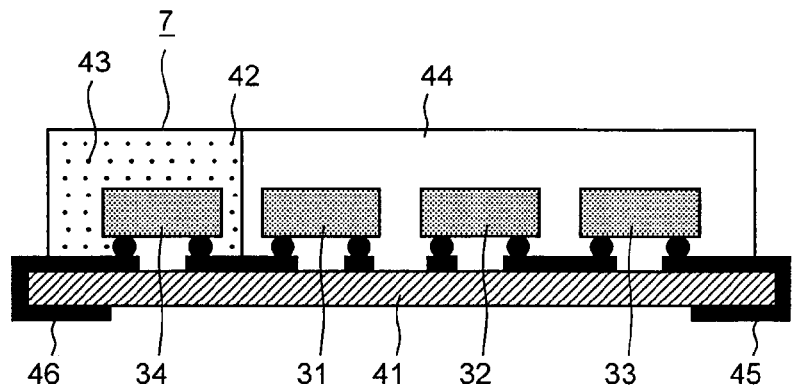
FIG. 18 exemplifies an arrangement of a light source in the display device shown in FIG. 2.
Figure 19:
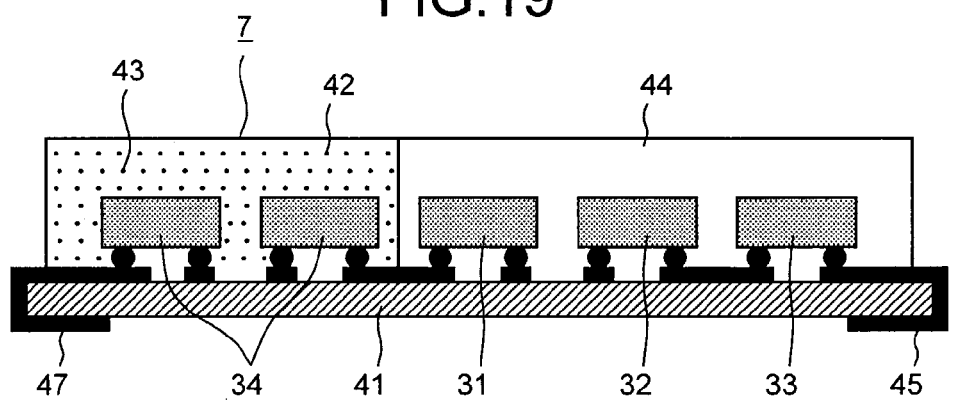
FIG. 19 exemplifies another arrangement of the light source in the display device shown in FIG. 2.

In the example shown in FIG. 18 or FIG. 19, the LEDs of red 31, green 32 and blue 33, and blue 34 for configuring the white LED 7 are arrayed on the substrate 41 in order reverse to that shown in FIG. 2. This is because a longer wavelength LED hardly responds to the fluorescent particles 43 and it is preferable to arrange such the LED closer to the resin 42 that contains the fluorescent particles 43 or the white LED 7. As the example shown in FIG. 18 or FIG. 19, those arranged adjacent to the white LED 7 include the red LED 31 first, then the green LED 32, and finally the blue LED 33. The arrangement of the LEDs is not limited in the above order but may be in other orders.

As explained in detail, according to the embodiment, the input RGB 16-bit data is converted into the sub-image data in four subfields corresponding to red, green, blue and white to control the shutter 2 in synchronization with each subfield for full-color display.

According to the embodiment, even though the variation in chromaticity of the white LED alone reflects directly on the variation in white balance, the variation in white balance is very small as described above and can be easily adjusted to a desired white level. This is performed by selecting the blue LED 34 for use as the light source in the white LED 7 in consideration of its characteristic, and adjusting the density and characteristic of the fluorescent material applied over the blue LED 34. Therefore, it is not required in the present embodiment to adjust the white balance after assembly of the display device. As a result, it is possible to downsize the display device and reduce cost without the need for any adjustment circuit or step.

To the contrary, if white is expressed using LEDs of red, green, and blue as is in the conventional art, variations in luminous intensity occur among the LEDs and effect directly on the white balance. Accordingly, it is required to adjust the white balance at each display device after assembly of the display device, though this adjustment is extremely difficult as explained above. Therefore, it is required to provide sophisticated adjustment circuits, which in turn leads to an increase in the number of components and upsizing of the display device. As a result, adjustment steps are complicated and a longer time is required for adjustment disadvantageously.

According to the embodiment, the light source for white display includes the white LED 7 only. Therefore, no variation can occur in white level due to ambient temperature variations and power at the time of driving. To the contrary, if white is expressed using LEDs of red, green, and blue as is in the conventional art, characteristics of luminous intensity to temperature differ among LEDs. Therefore, if LEDs are driven with a low current, ambient temperature variations and temperature differences due to differences in power among LEDs of respective colors cause variations in white level. In the conventional arrangement, LEDs of red, green, and blue have differences in deterioration characteristic and accordingly the white level varies gradually. This problem can also be solved with the use of the white LED 7.

The present invention is not limited in the above embodiment but can be modified variously. For example, a time-axis modulation may be applied to the gray-scale display method that converts the image data into the source-line drive signals Ss. In this case, a time for applying the source-line drive signals Ss varies depending on the sub-image data.

RGB analog signals may be employed as the input interface. In this case, through the same arithmetic processing as shown in the present embodiment, the RGB analog signals are converted into analog brightness signals of red, green, blue and white.

For example, in an arrangement for multicolored display device, a white display subfield may be added to subfields of two colors such as blue and red to display white and light colors. The white display is optimal for background and can improve the display quality particularly.

If a system includes software that employs the display device of the embodiment, data of red, green, blue and white each may consist of 6-bit data. Thus, means for the arithmetic processing is not required in the system.

LEDs of red, green, blue and white may be individually prepared and implemented on a substrate. Alternatively, if a commercially available product includes LEDs of red, green, and blue that are implemented on the same substrate and sealed, such the product and a white LED may be prepared and implemented on a substrate. The white LED may include an ultraviolet light emission LED covered with a white fluorescent material. A light source for each color may include a cold cathode ray tube and an organic LED.

The present invention is not limited to the transmissive display device but can be applied to a reflective display device such as a reflective projector.

As explained above, according to the present invention, it is possible to provide a display device that can easily achieve a desired chromaticity of the white level and suppress fluctuations in the white level caused by fluctuation factors such as temperature characteristics effectively.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A display device, comprising:
    a light source that includes
    a red light emitting diode that emits a red light;
    a green light emitting diode that emits a green light
    a blue light emitting diode that emits a blue light; and
    a white light emitting diode that emits a white light; and
    a shutter that controls transmission of reflection of the lights emitted from the light source,
    wherein a field is divided into a plurality of subfields to emit a specific color light corresponding to each subfield from the light source, and to control the shutter corresponding to each subfield, and
    wherein the number of the white light emitting diodes is equal to or greater than the number of each of the red light emitting diodes, the green light emitting diodes, and the blue light emitting diodes.

2. The display device according to claim 1, wherein the white light emitting diode includes a blue light emitting diode that is covered with a fluorescent material.

3. The display device according to claim 1, wherein the white light emitting diode is arranged at a location that is away from a location at which the blue light emitting diode is arranged as compared to locations at which the red light emitting diode and the green light emitting diode are arranged.

4. The display device according to claim 3, wherein the red light emitting diode is arranged adjacent to the white light emitting diode.

5. The display device according to claim 4, wherein the red light emitting diode, the blue light emitting diode, the green light emitting diode, and the white light emitting diode are implemented on the same substrate.

6. The display device according to claim 1, wherein the shutter comprises a liquid crystal panel.

7. The display device according to claim 1, wherein each subfield has a write period for inputting data to the shutter, and a display period for displaying an image based on the written data.

8. The display device according to claim 7, wherein each color light is emitted from the light source only during the display period in the corresponding subfield.

9. A display device, comprising:
a light source that emits a plurality of individually controllable color lights having different spectral characteristics, the color lights including a white light; and
a shutter that controls transmission or reflection of the lights emitted from the light source,
wherein a field is divided into a plurality of subfields to emit a specific color light corresponding to each subfield from the light source, and to control the shutter corresponding to each subfield,
wherein input data is separated into pieces of individual color data on a color light basis, and the least value of the individual color data is input to the shutter as sub-image data for white light display during the subfield corresponding to the white light to vary the amount of transmission or reflection at the shutter.

10. The display device according to claim 9, wherein a difference between the individual color data and the sub-image data for white light display is defined as sub-image data of each color for color lights other than the white light, and the sub-image data of each color is input to the shutter during a subfield corresponding to each color light to vary the amount of transmission or reflection at the shutter.

11. The display device according to claim 9, wherein each subfield has a write period for inputting data to the shutter, and a display period for displaying an image based on the written data, and wherein the sub-image data is input into the shutter during the write period.

12. A display device, comprising:
a light source that includes
a red light emitting diode that emits a red light;
a green light emitting diode that emits a green light
a blue light emitting diode that emits a blue light; and
a white light emitting diode that emits a white light; and
a shutter that controls transmission or reflection of the lights emitted from the light source,
wherein a field is divided into a plurality of subfields to emit a specific color light corresponding to each subfield from the light source,
wherein the device further comprises a controller to control the shutter corresponding to each subfield, and
wherein the number of the white light emitting diodes is equal to or greater than the number of each of the red light emitting diodes, the green light emitting diodes, and the blue light emitting diodes.

13. The display device according to claim 12,
wherein only the red light emitting diode turns on in the subfield for red light display, only the green light emitting diode turns on in the subfield for green light display, only the blue light emitting diode turns on in the subfield for blue light display, and only the white light emitting diode turns on in the subfield for white light display.

14. The display device according to claim 12, wherein each subfield has a write period for inputting data to the shutter, and a display period for displaying an image based on the written data.

15. The display device according to claim 14, wherein each color light is emitted from the light source only during the display period in the corresponding subfield.

16. The display device according to claim 12, wherein the highest brightness in the subfield for white light display is adjusted to be equal to a total of the highest brightness in the subfield for red light display, the highest brightness in the subfield for green light display and the highest brightness in the subfield for blue light display.

17. The display device according to claim 16, wherein the brightness in the subfield for white light display is adjusted by adjusting a forward current flowing into the white light emitting diode.

18. The display device according to claim 16, wherein the brightness in the subfield for white light display is adjusted by adjusting a time period for turning on the white light emitting diode.

19. A display device, comprising:
a light source that emits a plurality of individually controllable color lights having different spectral characteristics; and
a shutter that controls transmission or reflection of the lights emitted from the light source,
wherein a field is divided into a plurality of subfields to emit a specific color light corresponding to each subfield from the light source, and the device further comprises a controller to control the shutter corresponding to each subfield, wherein one of the subfields is employed for white light display, and
wherein input data is separated into pieces of individual color data on a color light basis, and the least value of the individual color data is input to the shutter as sub-image data for white light display during the subfield corresponding to the white light to vary the amount of transmission or reflection at the shutter.

20. The display device according to claim 19, wherein a difference between the individual color data and the sub-image data for white light display is defined as sub-image data of each color for color lights other than the white light, and the sub-image data of each color is input to the shutter during a subfield corresponding to each color light to vary the amount of transmission or reflection at the shutter.

21. The display device according to claim 19, wherein each subfield has a write period for inputting data to the shutter, and a display period for displaying an image based on the written data, and wherein the sub-image data is input into the shutter during the write period.

* * * * *